United States Patent [19]

Arai

[11] 3,943,460

[45] Mar. 9, 1976

[54] FREQUENCY CONVERSION SYSTEM

[75] Inventor: Minoru Arai, Tokyo, Japan

[73] Assignee: Iwatsu Electric Co., Ltd., Tokyo, Japan

[22] Filed: Sept. 20, 1974

[21] Appl. No.: 507,986

[30] Foreign Application Priority Data

Sept. 21, 1973 Japan............................ 48-105944

[52] U.S. Cl................ 331/16; 307/225 R; 328/25; 328/30; 331/51
[51] Int. Cl.$^2$.......................................... H03B 3/04
[58] Field of Search............ 331/16, 51; 328/15, 25, 328/30, 49; 307/225

[56] References Cited
UNITED STATES PATENTS 3,581,213   5/1971   Crump............................... 328/30
3,588,732   6/1971   Tollefson........................... 331/16

Primary Examiner—John Kominski
Attorney, Agent, or Firm—Haseltine, Lake & Waters

[57] ABSTRACT

A frequency conversion system for converting high to low frequencies. The system comprises a first frequency dividing means for frequency dividing the frequency of an input signal into 1/MN of the same, a voltage controlled oscillator, a second frequency dividing means for frequency dividing the output frequency of the voltage controlled oscillator into 1/(N + 1) of the same, a phase detector for controlling the voltage controlled oscillator such that the frequencies of the respective outputs of the first and second frequency dividing means are equal to one another, and means for sampling the input signal by using the output frequency of the voltage controlled oscillator to lower the frequency of the input signal to 1/N thereof.

3 Claims, 4 Drawing Figures

FREQUENCY CONVERSION SYSTEM

FIELD OF INVENTION

This invention relates to frequency conversion systems of the type useful for converting high frequencies to low frequencies.

BACKGROUND

One example of a known frequency conversion system as shown and discussed in greater detail hereinbelow and as shown in Japanese Patent Publication No. 21964-Showa 46 "Frequency Conversion System" is such that an input frequency $f_{in}$ is lowered to $1/N$ thereof by a frequency dividing circuit. The resultant frequency $f_{in/N}$ and an oscillation frequency $\Delta f$ of another low frequency oscillator are combined by a carrier wave single side-band modulation system to produce a frequency of $(f_{in/N} + \Delta f)$, and the input frequency $f_{in}$ is sampled to obtain as an output the product $(N \cdot \Delta f)$ of the frequency dividing ratio N and $\Delta f$, and this signal $(N \cdot \Delta f)$ is gated by $\Delta f$ to produce a burst signal of N, and by lengthening a gate time in proportion to this N value a converted low frequency of $(f_{in/N})$ is gated with the gate time set to N times, and the frequency is measured.

If, namely:

$f_{in}$: input frequency $f_{in/N}$ output frequency of synchronous frequency dividing circuit $f_{in/N} + \Delta f$: output frequency of frequency combining circuit (sampling frequency)

$\Delta t$: slued rate, the slued rate $\Delta t$ is the difference between the reciprocals of $f_{in/N}$ and $(f_{in/N} + \Delta n)$, that is, $$\Delta t = \frac{1}{\frac{f_{in}}{N}} - \frac{1}{\frac{f_{in}}{N} + \Delta f} \quad (1)$$

If, further, it is so assumed that fL is the low frequency of a sampler output, $$\frac{1}{fL} = \frac{1}{\frac{f_{in}}{\Delta t}} \times \frac{1}{\frac{f_{in}}{N} \times \Delta f} \quad (2)$$

From the formulas (1) and (2), it results that $$fL = N \cdot \Delta f \quad (3)$$

$$fL \Delta f = N \cdot \Delta f / \Delta f = N \quad (4)$$

This circuit, however, requires obtaining a burst signal of N and also lengthening of the gate time of the counter by pre-setting this N value. Thus, the circuit is somewhat defective in that the circuit construction and operation are complicated. Also, the operation thereof is somewhat unstable in relation to an input signal which is extremely high in frequency.

SUMMARY OF INVENTION

An object of this invention is to simplify circuits of the above-noted type by the use of a digital type technique and to provide an improved frequency conversion system which can effect a stable operation even for high frequencies.

To achieve the above and other objects of the invention, there is provided a frequency conversion system for converting high to low frequencies. The system comprises a first frequency dividing means for frequency dividing the frequency of an input signal into 1/MN of the same, a voltage controlled oscillator, a second frequency dividing means for frequency dividing the output frequency of the voltage controlled oscillator into $1/(N + 1)$ of the same, a phase detector for controlling the voltage controlled oscillator such that the frequencies of the respective outputs of the first and second frequency dividing means are equal to one another, and means for sampling the input signal by using the output frequency of the voltage controlled oscillator to lower the frequency of the input signal to 1/N thereof.

BRIEF DESCRIPTION OF DRAWING

This invention will next be explained in detail with reference to the accompanying drawing in which.

DETAILED DESCRIPTION

Figure 1:
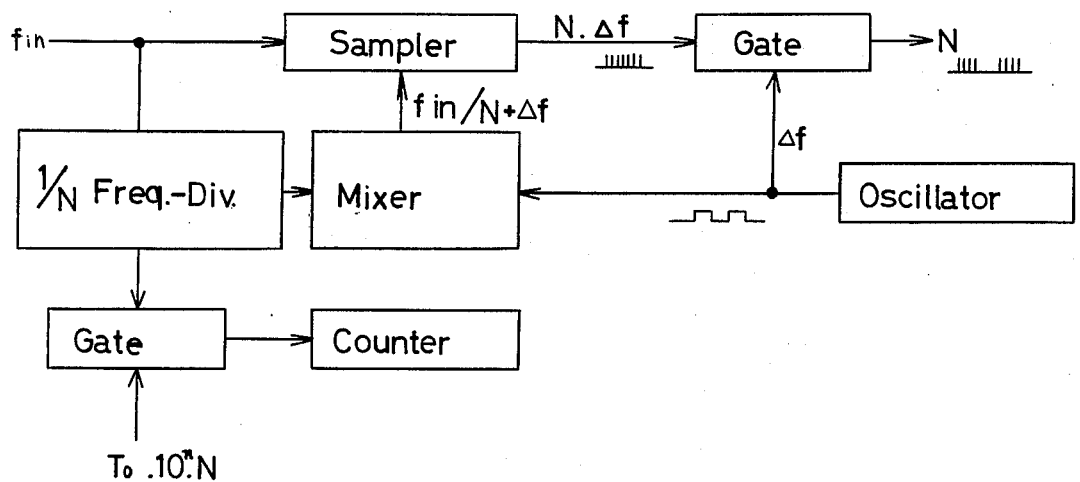
FIG. 1 is a block diagram showing one example of a frequency conversion circuit according to a conventional prior art sampling system.

As shown in FIG. 1, a known circuit may be such that an input frequency $f_{in}$ is lowered to 1/N thereof by a frequency dividing circuit. The resultant frequency $f_{in/N}$ and an oscillation frequency $\Delta f$ of another low frequency oscillator are combined by a carrier wave single side-band modulation system to produce a frequency of $(f_{in/N} + \Delta f)$, and the input frequency $f_{in}$ is sampled to obtain as an output the product $(N \cdot \Delta f)$ of the frequency dividing ratio N and $\Delta f$, and this signal $(N \cdot \Delta f)$ is gated by $\Delta f$ to produce a burst signal of N, and by lengthening a gate time in proportion to this N value a converted low frequency of $(f_{in/N})$ is gated with the gate time set to N times, and the frequency is measured. The equations for this circuit have been shown hereinabove.

Figure 2:
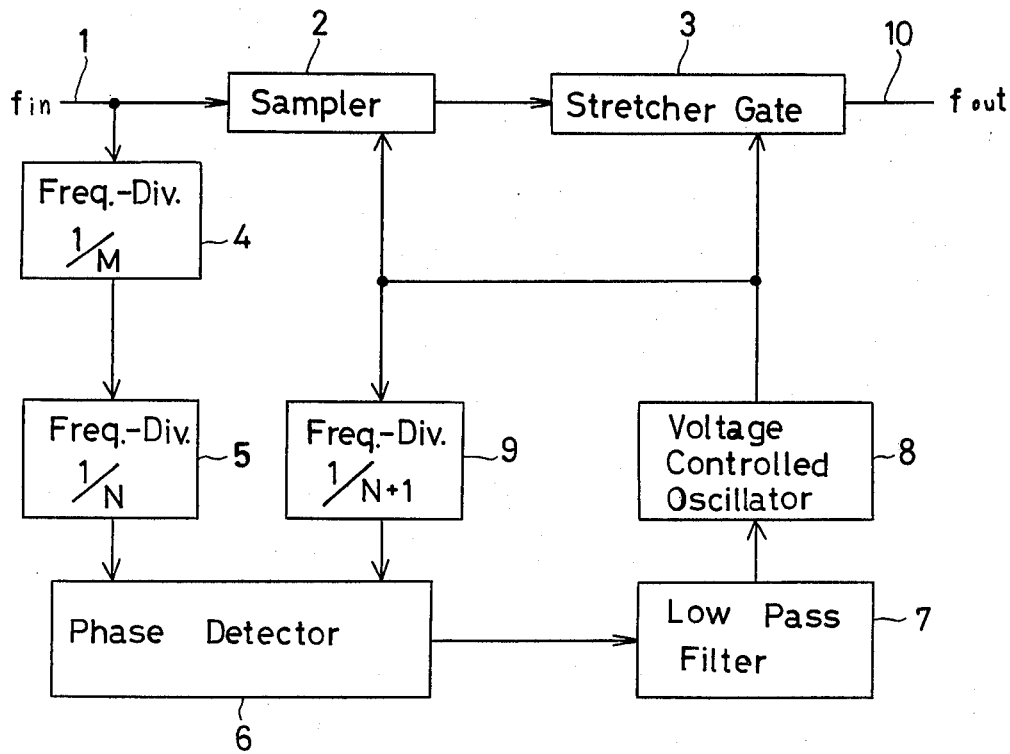
FIG. 2 is a block diagram of a circuit of this invention.

FIG. 2 is a block diagram of the circuit of this invention. Element 1 is an input terminal for receiving an input signal $f_{in}$. Circuit 2 is a sampler and circuit 3 is a stretcher gate which is a second gate for obtaining an envelope of the output signal of the sampler 2. Circuit 4 is a 1/M frequency dividing circuit and circuit 5 is a 1/N frequency dividing circuit. Circuit 6 is a phase difference detector and circuit 7 is a low-pass filter (LPF) for smoothing the output signal of the phase difference detector 5 and converting the same to a direct current level. Circuit 8 is a voltage controlled oscillator(VCO), circuit 9 is a $1/(N + 1)$ frequency dividing circuit and element 10 is an output signal terminal.

The operation of the above circuit of the invention is next explained as follows:

The output frequency of the 1/N frequency dividing circuit 5 is $$f_{in}/M \cdot N \quad (6)$$

If the output frequency of the VCO 8 is $f_v$, the output frequency of the $$1/(N+1) \qquad (7)$$

If a phase lock loop constructed by the phase difference detector 6, the LPF 7 and the VCO 8 are so controlled that the frequencies represented by the formulas (6) and (7) may be equal to one another, the following formula is established.

$$f_{in}/M \cdot N = f_v/(N+1)$$

Accordingly, $$f_v = \left(\frac{f_{in}}{M} \cdot \frac{1}{1+\frac{1}{N}}\right) \qquad (8)$$

If the slued rate is $\Delta t$, $$\Delta t = \frac{1}{\frac{f_{in}}{M}} - \frac{1}{\frac{f_{in}}{M}\left(1+\frac{1}{N}\right)} \qquad (9)$$

If the conversion output frequency of the output terminal 10 is $f$ out, (time of one cycle of $f_{out}$) = $\begin{bmatrix}\text{the "number" of}\\ \text{sampling for one}\\ \text{cycle of the}\\ \text{input frequency}\\ f_{in}\end{bmatrix} \times \begin{bmatrix}\text{sampling}\\ \text{interval}\\ \text{time}\end{bmatrix}$ $$\frac{1}{f_{out}} = \frac{\frac{1}{f_{in}}}{\Delta t} \times \frac{1}{f_v}$$

$$= \frac{\frac{1}{f_{in}}}{\frac{f_{in}}{M} - \frac{f_{in}}{M}\left(1+\frac{1}{N}\right)} \times \frac{1}{\frac{f_{in}}{M}\left(1+\frac{1}{N}\right)}$$

$$= \frac{\frac{1}{f_{in}}}{\left(1+\frac{1}{N}-1\right)} \times \frac{1}{\frac{f_{in}}{M}\left(1+\frac{1}{N}\right)}$$

$$= \frac{n}{f_{in}}$$

Accordingly, $$f \text{ out} = f_{in}/N \qquad (10)$$

More particularly, as shown by formula (10), a low frequency signal converted to the frequency $f_{in}N$ is obtained at the output terminal 10.

Figure 3:
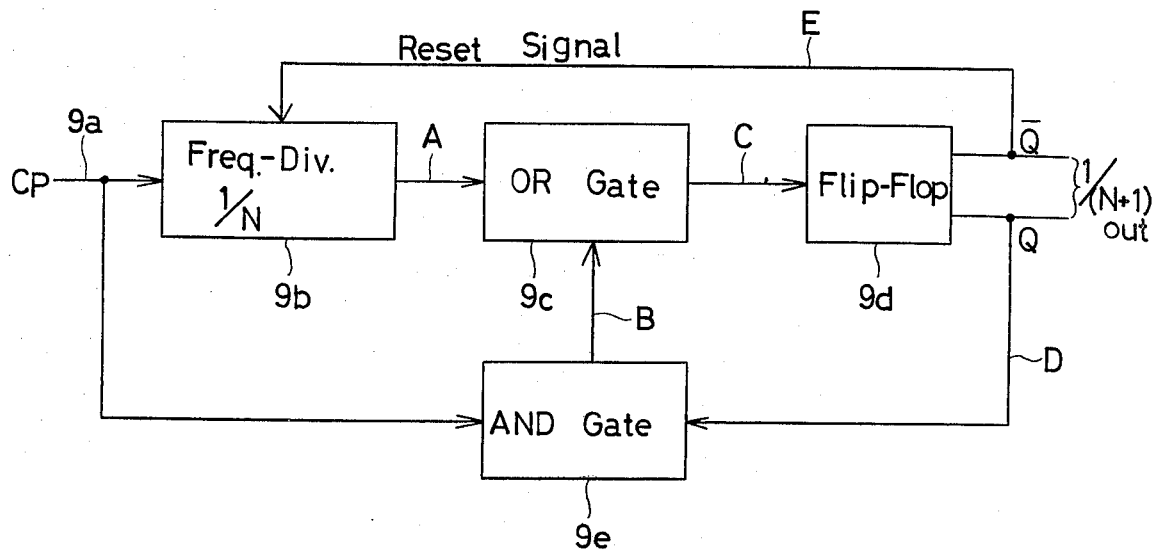
FIG. 3 is a block diagram of an example of a $1/(N + 1)$ frequency dividing circuit which can be used in this invention.

FIG. 3 is an example of the $1/(N+1)$ frequency dividing circuit. Herein, element 9a is an input terminal for receiving a clock pulse CP and circuit 9b is a $1/N$ frequency dividing circuit. Circuit 9c is a logical summation gate circuit and circuit 9d is a flip-flop circuit having Q, $\bar{Q}$ as outputs. Circuit 9e is a logical product gate circuit.

Figure 4:
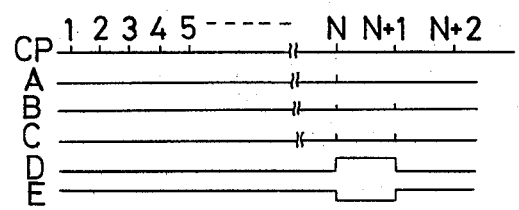
FIG. 4 is a timing chart of signals appearing at respective portions in the circuit of FIG. 3.

In FIG. 4, A, B, C, D and E show respective wave forms. As shown in FIG. 4, the output signal D of the flip-flop 9d exhibits a $1/(N+1)$ frequency dividing output.

As explained above, according to the construction of this invention, all but the first and second analog gates of the sampler and the stretcher can be formed into a digital type circuit, so that simplification of the circuit and stabilization of the circuit operation can be achieved. If the arrangement is used as an input section of a digital counter or the like, a super high-frequency operation can be effected.

What is claimed is:

1. Frequency conversion apparatus for converting the frequency of an input signal, said apparatus comprising first frequency dividing means for dividing the frequency of the input signal by a factor MN, where M and N are respective frequency dividing factors, a voltage controlled oscillator, a second frequency dividing means for dividing the frequency of said oscillator by a factor N + 1, phase detector means controlling said oscillator so that the frequencies of the outputs of the first and second dividing means are equal, sampler means for sampling the input signal under the control of said oscillator, and a stretcher gate producing an output signal and being coupled and controlled by said oscillator and being coupled to and receiving an input from said sampler means, said second frequency dividing means comprising a frequency divider, an OR gate coupled to said divider, means to feed clock pulses to said divider, a flip flop coupled to said OR gate, and an AND gate receiving said clock pulses and signals from said flip flop and applying an output signal to said OR gate, said flip flop transmitting reset signals to said divider.

2. Frequency conversion apparatus as claimed in claim 1 comprising a low pass filter coupling said phase detector means to said oscillator.

3. Frequency conversion apparatus as claimed in claim 1 wherein said first frequency dividing means includes two series connected dividers with frequency dividing factors of M and N respectively.

* * * * *